(12) United States Patent
Matsumoto et al.

(10) Patent No.: US 7,744,965 B2
(45) Date of Patent: Jun. 29, 2010

(54) METHOD AND APPARATUS FOR MANUFACTURING A ZINC OXIDE THIN FILM AT LOW TEMPERATURES

(75) Inventors: Takashi Matsumoto, Yamanashi (JP); Chitake Imazu, Yamanashi (JP); Shigeru Hagihara, Yamanashi (JP); Kazuhiro Kijima, Yamanashi (JP); Osamu Abe, Yamanashi (JP); Satoshi Hiraki, Yamanashi (JP); Yuichiro Fujikawa, Yamanashi (JP)

(73) Assignees: Yamanashi University, Kofu-shi (JP); Yamanashi Prefecture, Kofu-shi (JP); Nakaya Ltd., Nakakoma-gun (JP)

( * ) Notice: Subject to any disclaimer, the term of this patent is extended or adjusted under 35 U.S.C. 154(b) by 948 days.

(21) Appl. No.: 11/377,204

(22) Filed: Mar. 17, 2006

(65) Prior Publication Data

US 2007/0042216 A1 Feb. 22, 2007

(30) Foreign Application Priority Data

Aug. 18, 2005 (JP) ............................ 2005-237141

(51) Int. Cl.
*C23C 16/40* (2006.01)
*B32B 15/00* (2006.01)
(52) U.S. Cl. ............. 427/576; 427/255.31; 427/255.33; 428/640
(58) Field of Classification Search ................... None
See application file for complete search history.

(56) References Cited

U.S. PATENT DOCUMENTS 6,110,544 A * 8/2000 Yang et al. .................. 427/580
6,624,353 B2 * 9/2003 Gabower ..................... 174/388
6,664,565 B1 * 12/2003 Sano et al. ..................... 257/43

(Continued)

FOREIGN PATENT DOCUMENTS

EP 1 081 256 A2 3/2001

(Continued)

OTHER PUBLICATIONS

K. Nakahara et al.; Journal of Crystal Growth, vol. 227-228, Jul. 2001, pp. 923-928.

(Continued)

*Primary Examiner*—Timothy H Meeks
*Assistant Examiner*—Joseph Miller, Jr.
(74) *Attorney, Agent, or Firm*—Birch, Stewart, Kolasch & Birch, LLP

(57) ABSTRACT

The present invention provides a method and apparatus for forming a zinc oxide thin film with high transparency and high conductivity on a surface of a flexible substrate such as plastic without the indispensable requirement of doping impurities. In the method of forming a zinc oxide thin film by reacting oxygen radicals and zinc atoms on a surface of a substrate placed in a film-forming chamber evacuated to a vacuum, the density of crystal defects that are defects of the atomic arrangement of the zinc oxide thin film is controlled by the temperature of the substrate, and the zinc oxide thin film is thereby formed. It is suitable to form the film while maintaining the temperature of the substrate at 400° C. or less to intentionally disturb the regularity of the atomic arrangement of the zinc oxide thin film.

6 Claims, 15 Drawing Sheets

U.S. PATENT DOCUMENTS

| | | | |
|---|---|---|---|
| 2002/0025440 A1 | 2/2002 | Yamamoto et al. | |
| 2002/0025621 A1 | 2/2002 | Iwata et al. | |
| 2002/0058351 A1 | 5/2002 | Iwata et al. | |
| 2003/0211333 A1 | 11/2003 | Watanabe et al. | |
| 2003/0226499 A1* | 12/2003 | Hosseini Teherani | 117/84 |
| 2009/0166616 A1* | 7/2009 | Uchiyama | 257/43 |

FOREIGN PATENT DOCUMENTS

| | | |
|---|---|---|
| EP | 1 219 731 A1 | 7/2002 |
| EP | 1 313 134 A1 | 5/2003 |
| JP | 61-132902 A | 6/1986 |
| JP | 1-198339 A | 8/1989 |
| JP | 2001-271167 A | 10/2001 |
| JP | 2002-050229 A | 2/2002 |
| JP | 2003-89875 A | 3/2003 |
| JP | 2003-253445 A | 9/2003 |
| JP | 2003-264201 A | 9/2003 |
| JP | 2003-316276 A | 11/2003 |
| JP | 2004-221352 A | 8/2004 |

OTHER PUBLICATIONS

K. Matsubara et al.; Room-temperature deposition of Al-doped ZnO films by oxygen radical-assisted pulsed laser deposition; Thin Solid Films, vol. 422, No. 1-2, Dec. 20, 2002, pp. 176-179.

A.W. Ott et al.; Atomic layer-controlled growth of transparent conducting ZnO on plastic substrates, Materials Chemistry and Physics, Mar. 25, 1999, vol. 58, No. 2, Mar. 25, 1999, pp. 132-138.

Plasma assisted MBE growth and characterization of hexagonal ZnO on GaAs(111), Proceeding of 1st Asia-Pacific Workshop on Widegap Semiconductors, Mar. 9-12, 2003, pp. 153-156.

Takashi Matsumoto et al.; MBE growth and optical properties of ZnO on GaAs(111) substrates, Phys. Stat. Sol. (b), 241, No. 3, pp. 591-594 (2004).

Jaroslav Pavlik et al.; Study of argon/oxygen plasma used for creation of aluminium oxide films; Superficies Y Vacio, vol. 9, Dec. 1999, pp. 131-134.

* cited by examiner (a)

(b)

(a)

(b)

(c)

(a)  (b)

(a)  (b)

(a)

(b)

(c)

(a)

(b)

(c)

(a)

(b)

(a)

(b)

(a)

(b)

METHOD AND APPARATUS FOR MANUFACTURING A ZINC OXIDE THIN FILM AT LOW TEMPERATURES

BACKGROUND OF THE INVENTION

1. Field of the Invention

The present invention relates to a method and apparatus for manufacturing a zinc oxide thin film at low temperatures.

2. Description of Related Art

Transparent electrode films are indispensable to electronic components of a digital camera, DVD video, plasma display panel, organic EL panel and the like, and ITO (Indium Tin Oxide) films have been used widely in the transparent electrode films. However, Indium is expensive, further has the problem of resource exhaustion, and needs to be urgently replaced with another material.

Zinc oxide is chemically stable and conventionally used harmless material, and has an advantage of low environmental load. Among principal methods of manufacturing a thin film of zinc oxide are sputtering, organic metal chemical vapor deposition (CVD), and spray thermal decomposition method. Sputtering has been used the most widely, but has problems that the film has nonuniform electric resistivity and that the nonuniformity is remarkable when the film is formed at low temperatures.

Organic metal CVD has problems of generating a large mount of waste gas and imposing heavy loads on the environment. Problems of the spray thermal decomposition method are that heat of about 550° C. is necessary to obtain the high-performance film and that the film cannot be formed at low temperatures.

Another technique to form a zinc oxide thin film other than the above-mentioned methods is Molecular Beam Epitaxy (MBE) (see "Plasma assisted MBE growth and characterization of hexagonal ZnO on GaAs (1111)" Proceeding of $1^{st}$ Asia-Pacific Workshop on Widegap Semiconductors, 153-156 (2003) and "MBE growth and optical properties of ZnO on GaAs (1111) substrates" Phys. Stat. sol. (b), 241, 591-594 (2004)). However, formation of zinc oxide thin film disclosed in the these documents is to form the film at temperatures of 400° C. or more, and a problem arises that these methods cannot be applied to the case of using materials with low heat resistance such as plastic as a substrate. Another problem is that doping impurities is necessary to form the film to decrease the electric resistivity of the transparent electrode film.

Further, Japanese Patent Application Publication Nos.: 2003-89875 and JP 2001-271167 disclose the technique of forming a zinc oxide thin film using atmospheric glow discharge plasmas. Problems in the technique of both publication documents are that the plasmas are generated using inert gas and that the resistivity of the zinc oxide thin film is 3MΩ or more.

Furthermore, in the method of forming a zinc oxide thin film disclosed in these documents and the like, a substrate placed in a film-forming chamber evacuated to a vacuum is heated to 400° C. or more to accelerate the zinc oxide reaction and the film is thereby formed. Moreover, these methods do not provide sufficient conductivity, and have the need of doping impurities during formation of the film.

SUMMARY OF THE INVENTION

It is a principal object of the present invention to provide a method of forming a zinc oxide thin film with high transparency and high conductivity on a surface of a flexible substrate such as plastic without the indispensable requirement of doping impurities, and further provide a display and the like using the thin film.

Another object of the invention is providing a zinc oxide thin film manufacturing apparatus enabling the zinc oxide thin film provided with the aforementioned characteristics to be formed at high speed without using a complicated apparatus.

As a result of long-time research, the inventor of the present invention obtained new findings that when oxygen radicals react with zinc atoms at low temperatures, the regularity of the atomic arrangement of zinc oxide deteriorates, and as a result, visible light scatted by crystal defect portions to degrade the transparency, however, by controlling the crystal defect density to a predetermined density or less when the regularity of the atomic arrangement of zinc oxide deteriorates, the transparency is guaranteed in the visible region.

Further, by intentionally disturbing the regularity of the atomic arrangement of a zinc oxide thin film, the crystal defects can be used as carrier sources, and it is made possible to generate a large number of carriers from the carrier sources. Thus, new findings were obtained that it is possible to form a zinc oxide thin film with high conductivity without doping impurities, while ensuring the transparency.

In the present invention, in a method of forming a zinc oxide thin film by reacting oxygen radicals and zinc atoms on a surface of a substrate placed in a film-forming chamber evacuated to a vacuum, the density of crystal defects that are defects of the atomic arrangement of the zinc oxide thin film is controlled by the temperature of the substrate, and the zinc oxide thin film is thereby formed. The crystal defects are mainly of oxygen holes. As well as using the crystal defect as a carrier source, doping a dopant enables the resistivity of the zinc oxide thin film to be further decreased. It is suitable to control a supply amount of the dopant such that the ratio of the dopant to zinc atom in the zinc oxide thin film is in the range between 1:10 to 1:1000. Suitable as the dopant is aluminum, gallium, indium and chlorine.

It is suitable to form the film by maintaining the temperature of the substrate at 400° C. or less to intentionally disturb the atomic arrangement of the zinc oxide thin film. The film forming reaction of zinc oxide expressed by Zn0+O*→ZnO is exothermic reaction as described later, and it is suitable to control the temperature of the substrate virtually in the range of 0° C. to 400° C. It is thereby possible to form a zinc oxide thin film with high conductivity while ensuring the transparency.

It is preferable to control the temperature of the substrate by adjusting the distance between an oxygen radical source and the substrate and/or the distance between a zinc atom source and the substrate and/or the distance between a dopant source and the substrate. It is possible to control the temperature of the substrate by suppressing the effect of radiation heat of the oxygen radical source and zinc atom source and dopant source.

In the case of using as an oxygen radical source an oxygen plasma cell system of generating plasmas in a silica or alumina or sapphire tube filled with oxygen, generating oxygen radicals from the oxygen plasma cell, and supplying the oxygen radicals to a substrate, the temperature of the silica tube is about 350° C. or more at minimum, and needs to be 400° C. or more to increase the oxygen supply amount. As a result, the substrate is heated to 400° C. or more by radiation heat depending on conditions. However, by maintaining the distance between the oxygen plasma cell and substrate at a predetermined distance or more, it is possible to suppress the effect of radiation heat from the oxygen plasma cell and prevent increases in temperature of the substrate.

Further, in the case of using a system of vaporizing solid zinc to supply zinc atoms to a substrate, a zinc crucible used in evaporating solid zinc needs to be heated to temperatures of at least 300° C. or more, and to increase the supply amount of zinc atoms, to be heated to 400° C. or more. Therefore, by controlling the distance between the zinc crucible and substrate, it is possible to control the effect of radiation heat from the zinc crucible. In other words, it is suitable to control the effect of radiation heat from the oxygen plasma cell and zinc crucible and dopant crucible by adjusting respective distances with the substrate.

It is suitable that the distance between the substrate and the oxygen radical source or zinc atom source is a mean free path or less of an oxygen radical or zinc atom, respectively. When the distance is set that enables the effects of radiation heat from the oxygen radical source and zinc atom source on the substrate to be adjusted to the desired temperature or less, if the distance is longer than the mean free path, part of the oxygen radicals and/or zinc atoms looses the energy before reaching the substrate, and cannot arrive at the surface of the substrate. Further, even when reaching the surface, such radicals and/or atoms degrade the reaction on the surface of the substrate. Therefore, it is preferable to set the distance that enables the effects of radiation heat to be adjusted to within a desired range and that is less than or equal to the mean free path.

It is suitable to control the temperature of the substrate to the desired temperature by forcefully cooling means. For example, it is preferable to dispose a pipe around and/or in a substrate holder, circulate water through the pipe to cool the substrate and control the temperature of the substrate.

As another method of intentionally disturbing the regularity of the atomic arrangement of the zinc oxide thin film, it is preferable to control a supply amount of the oxygen radical and/or zinc atom to the substrate, and thereby control the density of crystal defects that are defects of the atomic arrangement of the zinc oxide thin film. By supplying a larger supply amount of the zinc atom than that of the oxygen radical to the surface of the substrate, or supplying a smaller supply amount of the oxygen radical than that of the zinc atom to the surface of the substrate, the reaction lacks oxygen. It is thereby possible to control the concentration of crystal defects.

By controlling the crystal defects to within the range of $1\times10^{18}$ defects/cm$^3$ to $5\times10^{21}$ defects/cm$^3$, it is possible to provide the electric resistivity of $1\times10^{-4}$ Ωcm or less and the visible light transmittance of 80% or more. In addition, in the case where the high transmittance is not required, for example, in electro-magnetic shielding material and the like, the zinc oxide thin film with high conductivity may be formed by setting the density of crystal defects at $5\times10^{21}$ defects/cm$^3$ or more.

It is suitable to control the ratio between the oxygen radical supplied from the oxygen radical source and zinc atoms supplied from the zinc oxide source reacting on the surface of the substrate. On the surface of the substrate, when unreacted zinc atoms are deposited to the substrate during the reaction expressed by Zn (Zinc atom)+O*(Oxygen radical)→ZnO, the crystal defect (lattice defect) arises. By adjusting the ratio between the supply amount of the zinc atom and the supply amount of the oxygen radical, it is possible to control the density of crystal defects. It is thereby possible to form the zinc oxide thin film with high conductivity without doping the impurity. The supply amounts of the zinc atom and the oxygen radical can be controlled by controlling the temperature of the zinc crucible and the exciting power of oxygen plasma cell or adjusting the capacity of the zinc crucible and oxygen plasma cell, respectively.

It is suitable to control the density of crystal defects in film formation by considering the density of crystal defects recovered by the heat treatment process after forming the zinc oxide thin film.

Transparent electrode films for use in electric/electronic devices sometime undergo various heat treatment processes after forming the films. For example, the transparent electrode film used in the plasma display is exposed to heat treatment of about 500° C. for about three hours during the process of forming the hub electrode using silver paste. Therefore, during the heat treatment process, the density of crystal defects of the zinc oxide thin film changes (oxygen holes are recovered). The carrier sources are thereby reduced, and the conductivity decreases. Then, if a zinc oxide thin film is formed by beforehand factoring in the density of crystal defects (the density of oxygen holes) recovered by the subsequent heat treatment process, it is possible to finally form the zinc oxide thin film with the desired conductivity and transmittance.

The present invention provides a zinc oxide thin film manufacturing apparatus comprising a film-forming chamber evacuated to a vacuum, an oxygen plasma cell that is disposed in the film-forming chamber and that is provided with fine holes to inject oxygen radicals, a zinc crucible that is disposed in the film-forming chamber and that generates vapor of zinc atoms, a dopant crucible that is disposed in the film-forming chamber and that generates vapor of dopant atoms, and a substrate holder that is disposed in the film-forming chamber and that holds a substrate with a surface on which a zinc oxide thin film is formed by reaction of the oxygen radicals and the zinc atoms, where the distance between the substrate and an oxygen radical source and/or the distance between the substrate and a zinc atom source is respectively set at a mean free path or less of the oxygen radical or zinc atom, and that means is provided for holding an effect of radiation heat from the oxygen radical source and/or the zinc atom source at 400° C. or less.

It is a feature providing temperature controlling means for controlling the temperature of the substrate holder to 400° C. or less. By providing the substrate holder with the temperature controlling means, the temperature of the substrate can be controlled freely and readily, and it is thus possible to adjust the reaction rate of the zinc oxide thin film. As a result, it is possible to generate lattice defects caused by the supplied oxygen radicals and zinc atoms and zinc atoms remaining unreacted, and to control the density of lattice defects.

It is suitable to provide the zinc oxide thin film manufacturing apparatus with means for doping substances. For example, by doping impurities such as aluminum, gallium, indium, chlorine or the like during formation of a zinc oxide thin film, it is possible to further decrease the electric resistivity.

The oxygen plasma cell and/or zinc crucible is preferably provided with a radiation plate to control the effect of radiation heat from the oxygen plasma cell or zinc crucible on the substrate, respectively.

The oxygen plasma cell is preferably of capacitive coupling type ring-shaped electrodes. By using the capacitive coupling type ring-shaped electrodes, it is possible to facilitate generation of plasma than in ICP (Inductive coupling plasma). For example, providing the ring-shaped electrodes outside the oxygen plasma cell facilitates adjustment of intensity of plasma generation and maintenance and thus is preferable.

According to the present invention, it is possible to form a transparent zinc oxide thin film with high transmittance and high conductivity on a surface of a flexible substrate such as plastic without the indispensable requirement of doping impurities. Further, it is possible to form a zinc oxide thin film at high speed without using a complicated apparatus.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Figure 1:
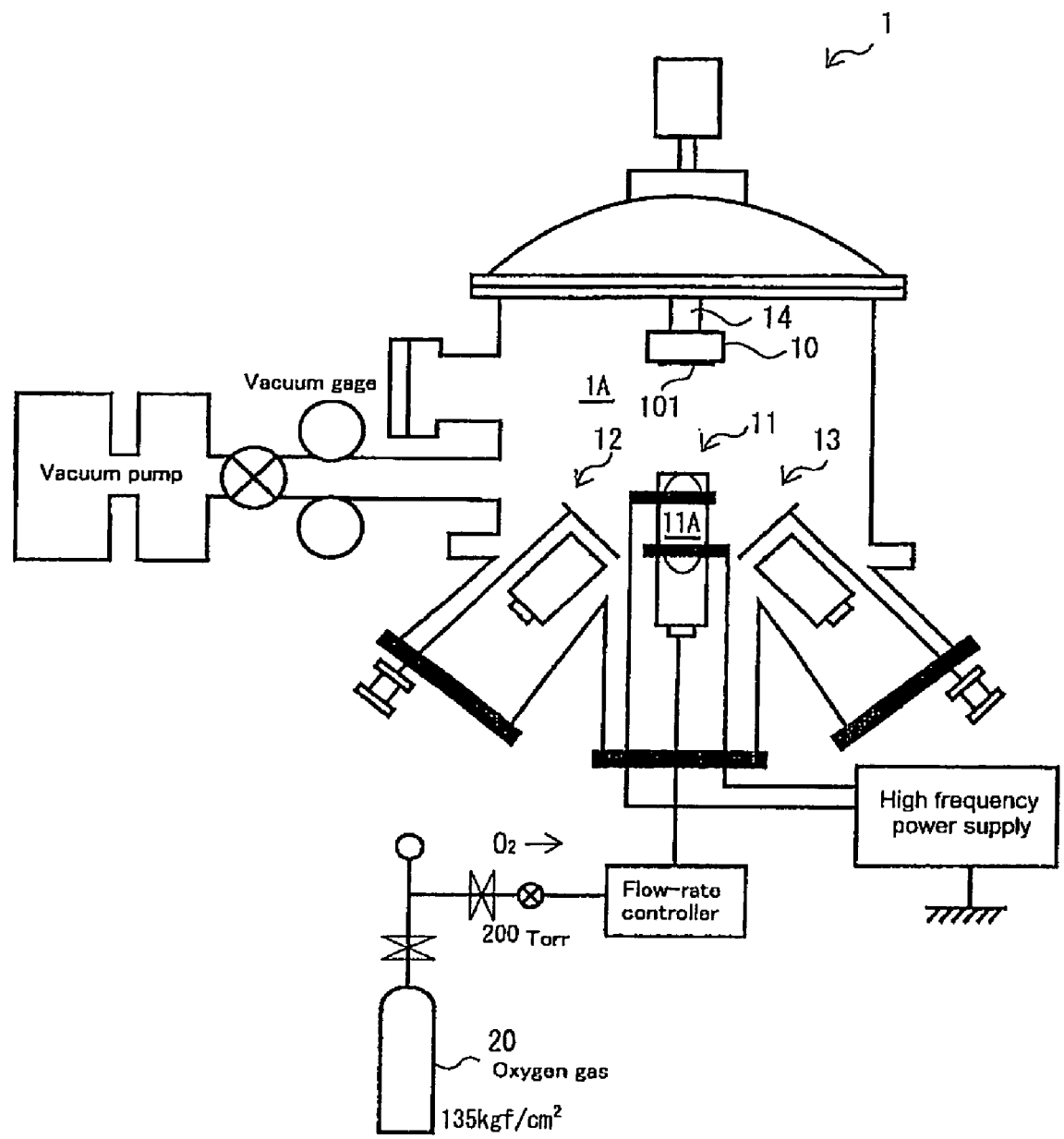
FIG. 1 is a view showing an entire apparatus for manufacturing a zinc oxide thin film.

An embodiment of the present invention will specifically be described below with reference to accompanying drawings. However, the present invention is not limited to the embodiment. FIG. 1 is a view showing an entire apparatus for manufacturing a zinc oxide thin film.

The apparatus for manufacturing a zinc oxide thin film 1 is basically comprised of a film-forming chamber 1A, substrate holder 10, oxygen plasma cell 11, and zinc crucible 12. In the case of aiming at improving the conductivity of a zinc oxide thin film, a dopant (impurities), for example, aluminum, gallium, indium, chlorine or the like is placed in a dopant crucible 13, and evaporated to be doped in forming the zinc oxide thin film.

The film-forming chamber 1A is held at a vacuum by a vacuum pump. The degree of vacuum is ideally ultrahigh vacuum ($10^{-10}$ torr), but there is a problem that the cost of the apparatus increases in proportion to an increase in the degree of vacuum. Therefore, the degree of vacuum may be determined by relationships between the mean free path of the oxygen radical and a distance between the oxygen plasma cell 11 and the substrate 101 and between the mean free path of the zinc atom and a distance between the zinc crucible 12 and the substrate 101. The pressure is set at $10^{-5}$ torr or less in this embodiment. Details will be described later.

Oxygen gas is provided to the oxygen plasma cell 11 from an oxygen cylinder 20 at pressure between about 20 and 200 torr via a flow-rate controller. Plasma space 1A inside the oxygen plasma cell 11 becomes a glow discharge state by the energy supplied from the high-frequency power supply. In the plasma space 1A, the oxygen gas supplied from the oxygen cylinder 20 becomes oxygen radicals (O*) and oxygen ions ($O^+$) generated in the oxygen plasma, and when passed through fine holes provided in an injection opening, the oxygen ions ($O^+$) become oxygen radicals (O*) with the oxygen radicals (O*) not changed, whereby the oxygen radicals are injected to the direction of the substrate 101. In addition, the degree of vacuum inside the plasma space 1A is basically determined according to Paschen's law, and suitably, about $10^{-2}$ to $10^{-3}$ torr.

Figure 2:
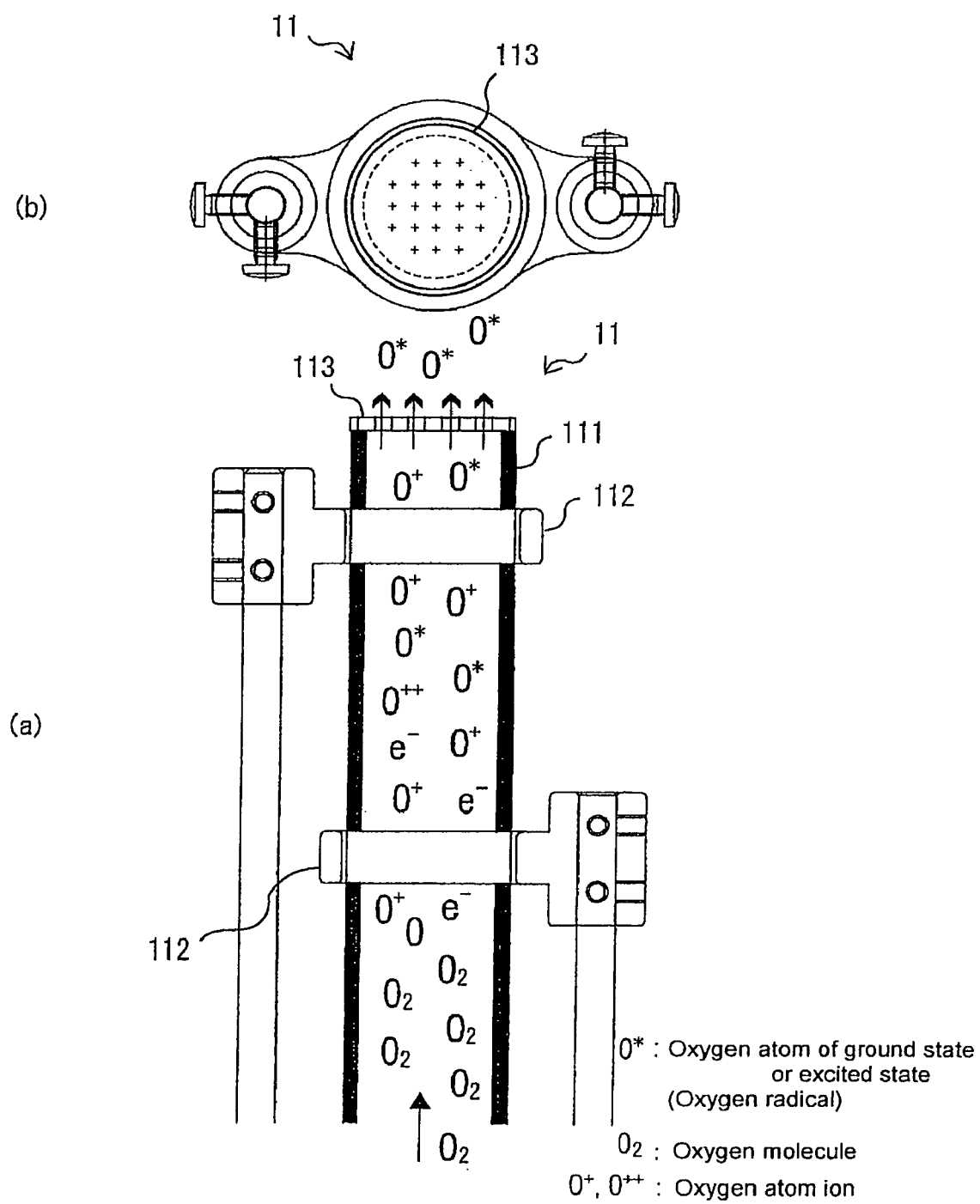
FIG. 2 is a detail view of an oxygen plasma cell.

FIG. 2 is a detail view of the oxygen plasma cell 11. To generate oxygen radicals, the oxygen plasma cell 11 is held at the degree of vacuum of about 1 mm to 100 mm torr, and the oxygen gas is supplied to the cell 11 from the oxygen cylinder 20 to fill the cell 11 with oxygen. A high voltage is applied to between the ring-shaped electrodes 112 from the high-frequency power supply to generate oxygen plasmas in the plasma space 1A. The generated oxygen plasmas are injected from fine holes provided in the upper portion of the oxygen plasma cell 11 as oxygen radicals. The oxygen plasma cell 11 is preferably a silica tube, but not limited thereto, and any materials are applicable until impurities elute by generation of the plasma.

In FIG. 2(a), the ring-shaped electrodes 112 are disposed around the peripheries of the oxygen plasma cell 11. For example, by applying a potential difference of 1000 volts of 13.56 MHz to between the electrodes, glow discharge is generated inside the silica tube 111 to cause a plasma state. By providing ring-shaped glow discharge electrodes around the peripheries of the silica tube 111, provided are features that it is possible to apply the high voltage easily to between the electrodes, and make the electric field uniform inside the plasma space. Further, there is another feature that the discharge electrodes attached outside facilitate their operation and maintenance.

ICP (Induction Coupling Plasma) has conventionally been used as an electrode to generate plasmas, but using the ring-shaped electrodes enable plasmas to be generated easily with less oxygen gas than in ICP.

The glow discharge starts when the high voltage of about 1000 volts at 13.56 MHz is applied to between the ring-shaped electrodes 112. By glow discharge, the oxygen gas inside the plasma space between the ring-shaped electrodes 112 becomes plasmas such as oxygen ions, oxygen atoms of the ground state, oxygen atoms of the excited state, electrons and the like ($O^+$, $O^{++}$, O, $O^*$, $e^-$ and the like), and oxygen radicals are ejected from the plasma space toward the film-forming chamber 1A with a higher degree of vacuum through the fine holes 113.

FIG. 2(*b*) shows an injection plane of oxygen radicals of the oxygen plasma cell 11. Oxygen ions ($O^+$, $O^{++}$) emit the energy to transfer from the ion state to radical state when passed through the fine holes 113, become oxygen radicals ($O^*$), and are injected to inside the film-forming chamber. It is preferable to provide a plurality of fine holes 113 to release oxygen radicals uniformly into the film-forming chamber, and a diameter of the fine holes is preferably about 0.2 mm.

Figure 3:
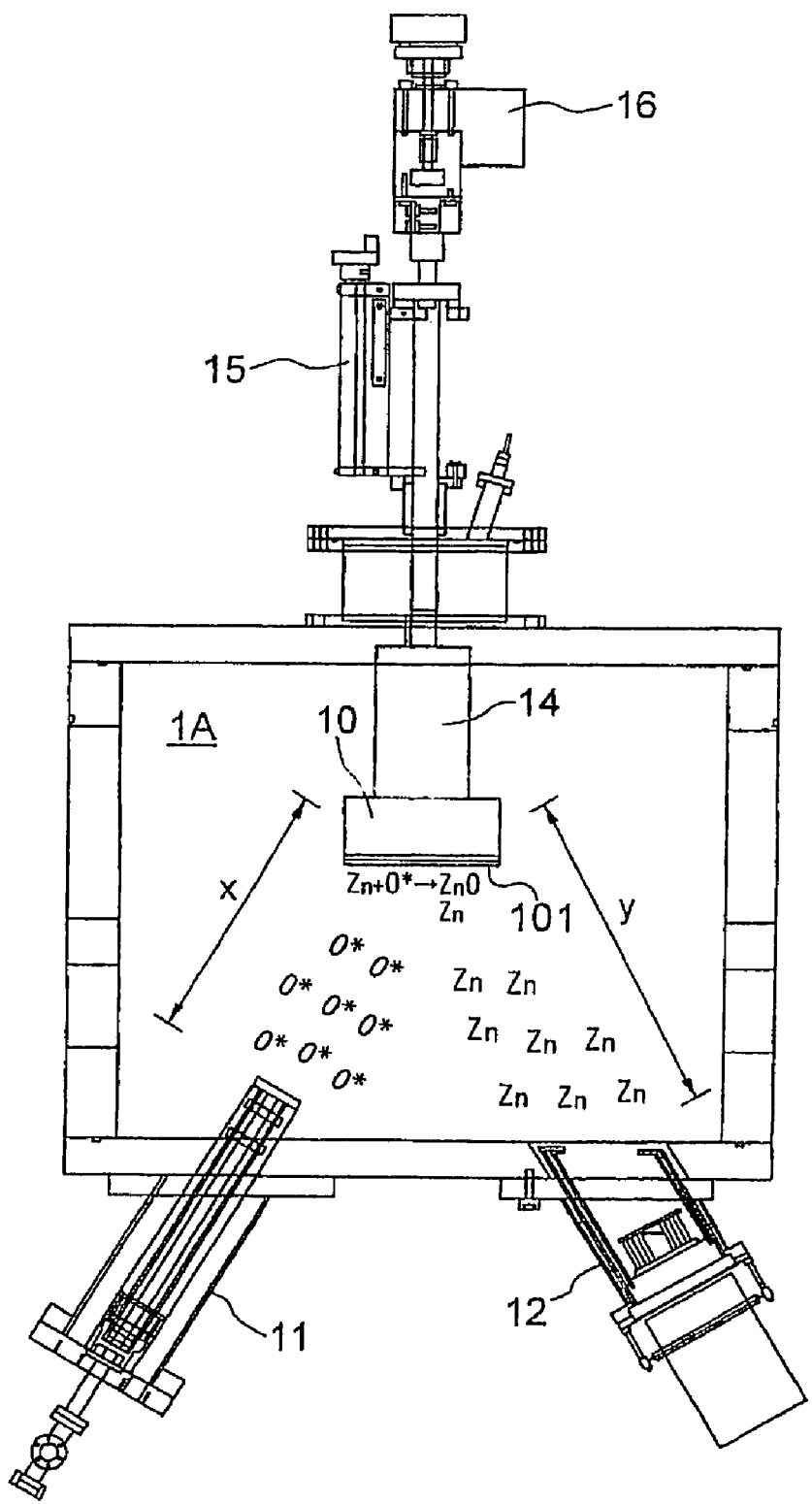
FIG. 3 is a detail view of the apparatus for manufacturing a zinc oxide thin film with a film-forming chamber centered.

FIG. 3 shows an apparatus for manufacturing a zinc oxide thin film where the oxygen plasma cell 11 and zinc crucible 12 are disposed respectively on the left and right sides as viewed in the figure without the dopant and crucible 13 in the apparatus for manufacturing a zinc oxide thin film as shown in FIG. 1. Solid zinc in the zinc crucible 12 is heated to high temperatures (300° C. to 350° C.), becomes vapor zinc (zinc atoms), and evaporates toward the substrate 101 (for example, plastic substrate) held by the substrate holder 10. A material of the zinc crucible is not limited particularly unless the material melts at high temperatures. In terms of high thermal conductivity and the like, preferably is a cylindrical crucible made of molybdenum with the inner surface covered with silica glass or ceramics.

Zinc atoms (Zn) evaporated from the zinc crucible 12 and oxygen radicals ($O^*$) injected from the oxygen plasma cell 11 cause reaction on the substrate 101 according to the equation of $Zn + O^* \rightarrow ZnO$, and the reaction is exothermic reaction. This is because enthalpy of formation to form zinc oxide from zinc atoms and oxygen atoms is −3.16 eV/ZnO, and the chemical equation of $2Zn + O_2 \rightarrow 2ZnO + 6.32$ eV holds. The dissociation energy necessary to decompose one oxygen molecule to two oxygen atoms is 1.4 eV, resulting in the equation of $O_2 + 1.4$ eV $\rightarrow 2O$.

To form ZnO by reacting zinc atoms and oxygen atoms, above-mentioned two equations are added, resulting in an equation of $2Zn + 2O \rightarrow 2ZnO + 7.72$ eV, and as a result, the exothermic reaction equation of $Zn + O \rightarrow ZnO + 3.86$ eV holds. By this means, although the zinc oxide thin film has conventionally been formed by heating the substrate to 400° C. or more, it was first demonstrated that a zinc oxide thin film can be formed in principle without heating the substrate. In the case of forming a zinc oxide thin film on a flexible substrate such as plastic, it is only required to hold the temperature of the substrate at under the softening point of a material of the substrate.

It is necessary to consider following respects to hold the temperature of a substrate at a desired temperature or less. One is to control increases in temperature of the substrate 101 due to radiation heat from the zinc crucible 12 because the crucible 12 needs to be heated to 350° C. or more to evaporate zinc atoms. Another one is to control increases in temperature of the substrate 101 due to radiation heat from the oxygen plasma cell 11. To control these increases, a distance (X) between the oxygen plasma cell 11 and substrate and another distance (Y) between the zinc crucible 12 and substrate are adjusted by a substrate up/down mechanism 15 so that the temperature of the substrate is not more than the desired temperature due to radiation heat.

Meanwhile, it is necessary to prevent each of the oxygen radical and zinc atom from colliding with an impurity inside the film-forming chamber before reaching the substrate. Therefore, the distances (X) and (Y) both need to be less than respective mean free paths of the oxygen radical and zinc atom.

The mean free path is determined by the relationship with the degree of vacuum of the film-forming chamber, and it is necessary to consider the cost of the film forming apparatus, area to form a film in one processing and the like. It is possible to control the temperature of the substrate by determining the distances (X) and (Y) to meet the above-mentioned conditions. The substrate up/down mechanism 15 serves as such control means or a mechanism to move the substrate holder upward and downward.

In addition, to reduce the effect of radiation heat of the zinc crucible 12, a temperature control plate may be attached that controls the effect of radiation heat. In this case, a material of the temperature control plate may be stainless. Further, it is suitable to provide a cooling mechanism 14 that forcefully cooling the substrate holder 10 as means for preventing an increase in temperature of the substrate due to radiation heat.

The zinc atoms and oxygen radicals reaching the substrate 101 form a zinc oxide thin film by the reaction of the zinc atom and oxygen radical as described above, while diffusing two-dimensionally on the surface of the substrate 101. As the process of forming the zinc oxide thin film, it is considered that a crystal of zinc oxide first forms a small island, and grows gradually from the island as a seed, thereby forming a zinc oxide thin film.

When the substrate is of single crystal, for example, gallium arsenide (GaAs), the atomic arrangement of the substrate affects the crystal orientation of zinc oxide, and as a result, the crystal of zinc oxide grows along the crystal orientation of the substrate. However, when the substrate is plastic or the like, it is considered that since crystal orientations of islands generated and scattered on the substrate are different from one another, a polycrystal zinc oxide film is formed. In addition, to form a uniform zinc oxide thin film as possible, it is preferable to form the film while rotating the substrate 101 by a substrate rotating mechanism 16.

Example 1

Oxygen Plasma Cell

Figure 4:
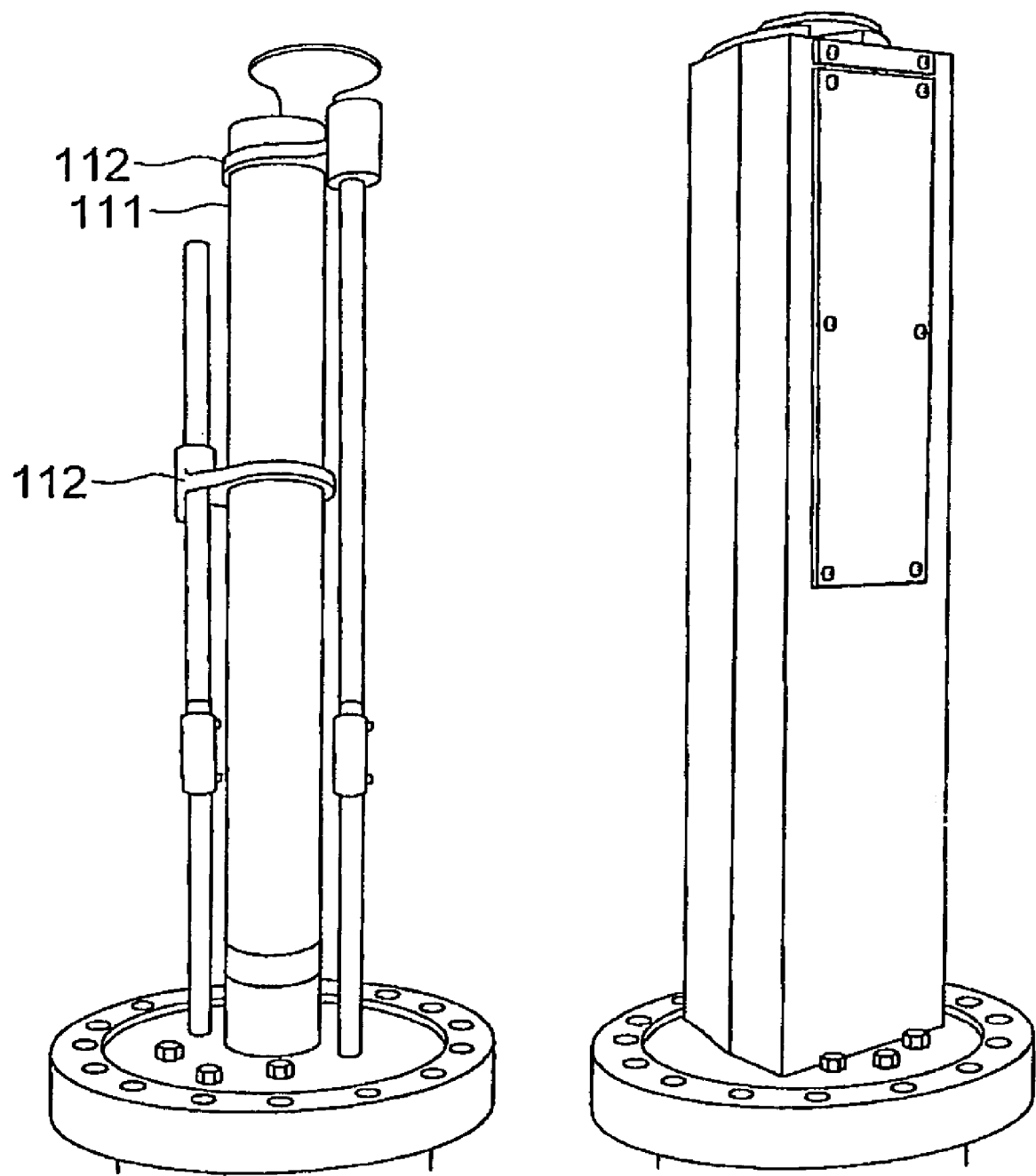
FIG. 4 is a view of an appearance of the oxygen plasma cell prototyped in Example 1.

FIG. 4 illustrates an appearance of a prototyped oxygen plasma cell. The oxygen plasma cell is made of a silica tube of height 300 mm, inner diameter of 26 mm, outer diameter of 30 mm and thickness of 2 mm, and provided in the upper portion with twenty-one oxygen radical injecting fine holes 113 each with a diameter of 0.2 mm to inject the oxygen plasma.

Figure 5:
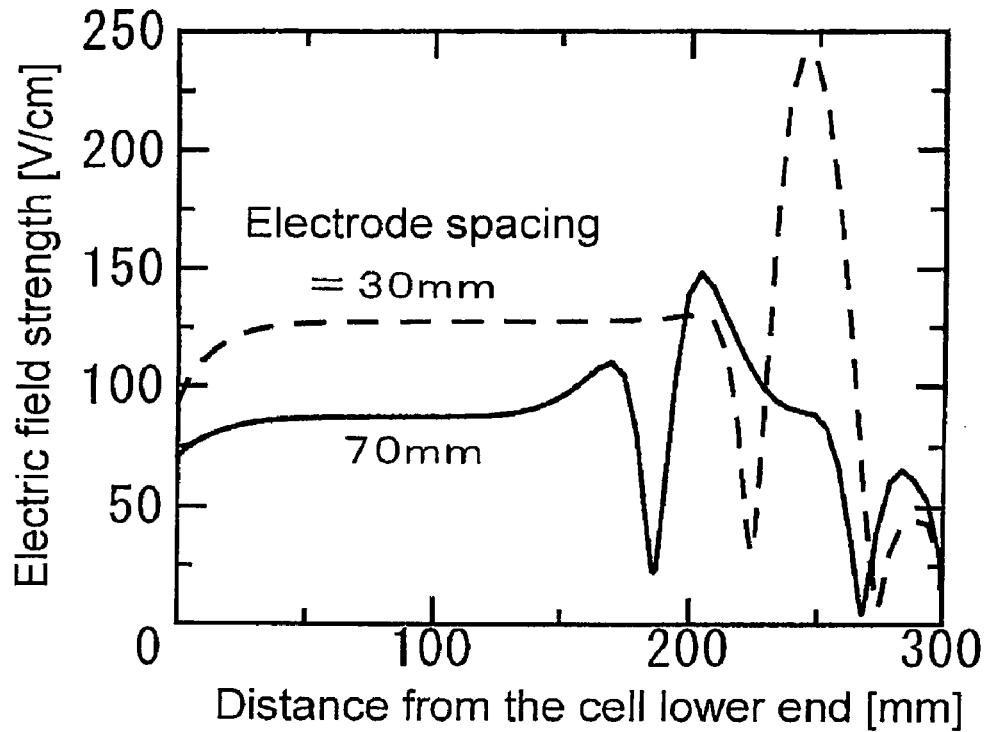
FIG. 5 shows graphs illustrating simulations of electric field strength distribution and potential distribution when the distance between ring-shaped discharge electrodes is varied.
Figure 5:
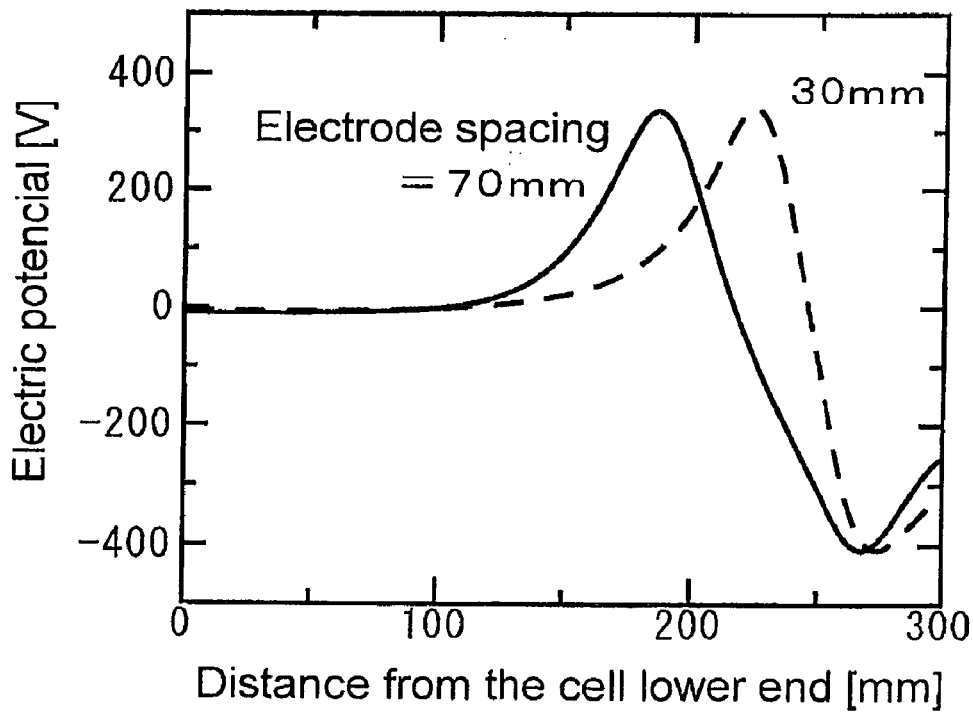

FIG. 5 shows graphs illustrating simulations of electric field strength distribution and potential distribution when the distance between ring-shaped discharge electrodes is varied. In addition, as physical properties used in the simulations, the dielectric constant of oxygen is 1.0005, the dielectric constant of silica is 3.8, the dielectric loss factor is 0.0001, the electric resistivity of copper is $1.55 \times 10^{-8}$ Ωcm, and a potential difference of 735 volts is applied between the ring-shaped electrodes 112.

The potential and electric field strength along the center axis of the cell are as shown in FIGS. 5(*a*) and 5(*b*), respectively. The maximum electric strength reaches 241 V/cm when the distance between the electrodes is 30 mm. As a result, it was found that the distance between the ring-shaped electrodes 112 is preferably about 30 mm in the oxygen plasma cell with the above-mentioned sizes, and the distance between discharge electrodes was set at 30 mm in the prototype apparatus.

Figure 6:
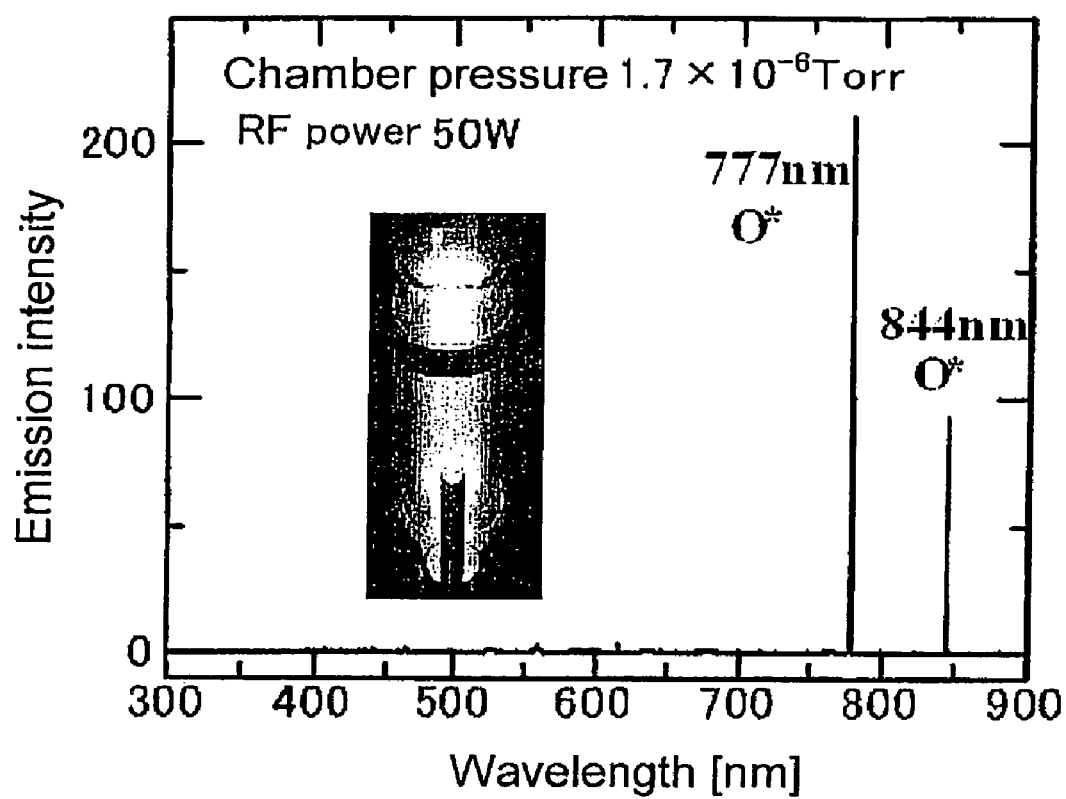
FIG. 6 is a graph showing characteristics of emission spectrum of plasmas generated by supplying high-frequency power (13.56 MHz, upper electrode of +500V, lower electrode of −500V) to the capacitive coupling discharge electrodes of the oxygen plasma cell.

FIG. 6 is a graph showing characteristics of emission spectrum of plasmas generated by supplying high-frequency power (13.56 MHz, a potential difference between the upper and lower electrodes is 1500 V (50 W)) to capacitive coupling glow discharge electrodes of the oxygen plasma cell as shown in FIG. 4. The degree of vacuum was $10^{-6}$ torr in the film-forming chamber. As shown in FIG. 6, strong spectra are observed at 777 nm and 844 nm, and generation of oxygen radicals was recognized.

Example 2

Formation of the Zinc Oxide Thin Film on a Glass Substrate

Figure 7:
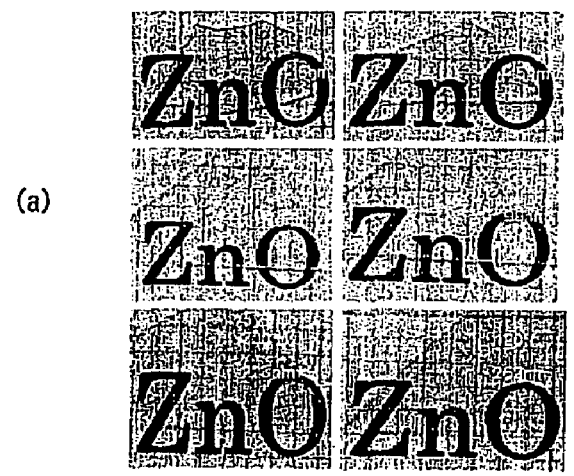
FIG. 7 illustrates characteristics of zinc oxide thin films formed on glass substrates widely used as a transparent substrate.
Figure 7:
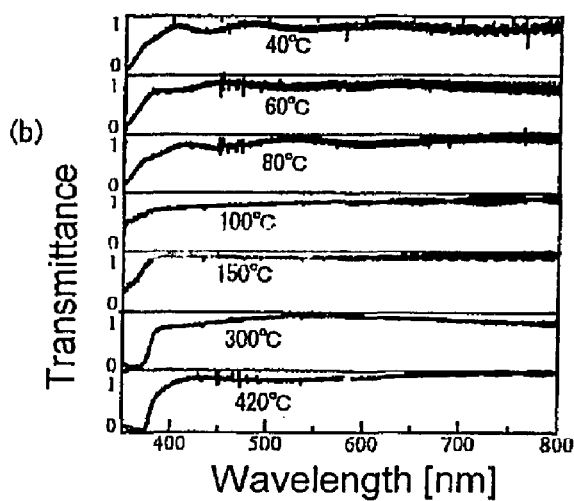
Figure 7:
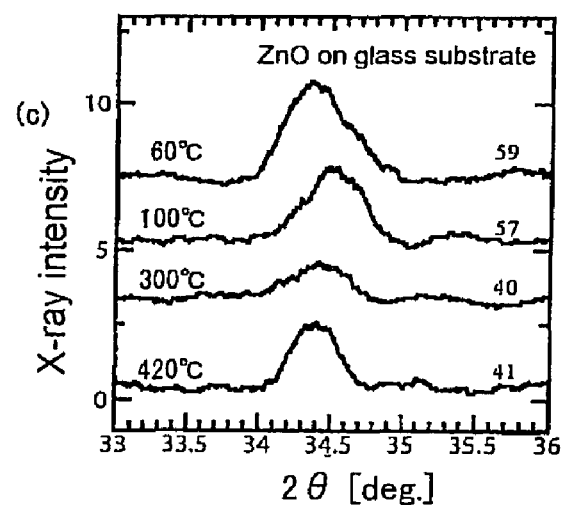

FIG. 7 illustrates characteristics of zinc oxide thin films formed on glass substrates widely used as a transparent substrate. The films were formed while changing the temperature of the substrate to 420° C., 300° C., 150° C., 100° C., 80° C., 60° C. and 40° C. FIG. 7(a) is a photograph showing conditions of the film formed at each temperature. In the figure, numeric values in the upper right portion indicate the film forming temperature and film thickness. It has been shown that films formed at either of temperatures have sufficient transparency.

FIG. 7(b) is a graph showing light transmittance spectra for each film-forming temperature. It has been shown that the films formed at either of temperatures have a light transmittance of 80% to 90% or more in the visible region (from 380 nm to 770 nm).

FIG. 7(c) is a graph showing X-ray diffraction spectra of zinc oxide thin films. As shown in FIG. 7(c), the formed thin films have the ZnO (0002) diffraction peak at nearly $2\theta=34.5$ degrees, and it was recognized that the formed thin films are zinc oxide.

Figure 8:
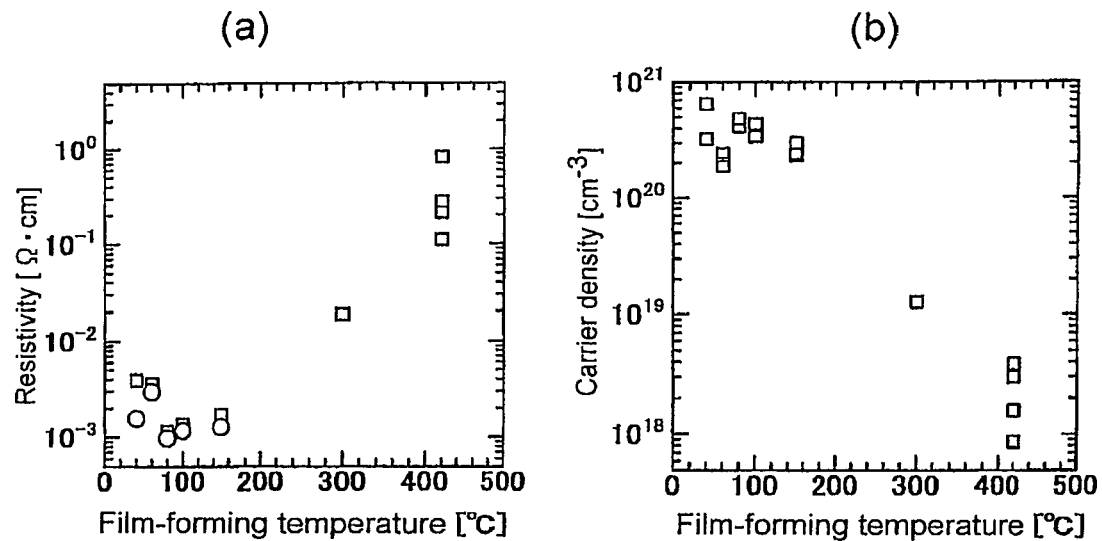
FIG. 8 shows graphs illustrating relationships between the film-forming temperature and resistivity and between the film-forming temperature and carrier density.

FIG. 8 shows graphs illustrating relationships between the film-forming temperature and resistivity and between the film-forming temperature and carrier density. It has been understood from FIG. 8(a) that the resistivity decreases as the film-forming temperature decreases, and from FIG. 8(b) that the carrier density increases as the film-forming temperature decreases. From the aforementioned facts, a result was obtained that the carrier density ranging from $1\times10^{20}$ to $5\times10^{21}$ carries/cm$^3$ is necessary to obtain the low resistivity of $1\times10^{-3}$ Ωcm or less in film-forming temperatures less than or equal to 100° C.

In the zinc oxide crystal of zinc oxide, the zinc atom and oxygen atom are boned one-to-one. When the ratio deviates from this rate, a defect occurs. Defects generated in a zinc excessive state (oxygen shortage state) act as carrier sources, and are rather preferable for the conductive film.

Figure 9:
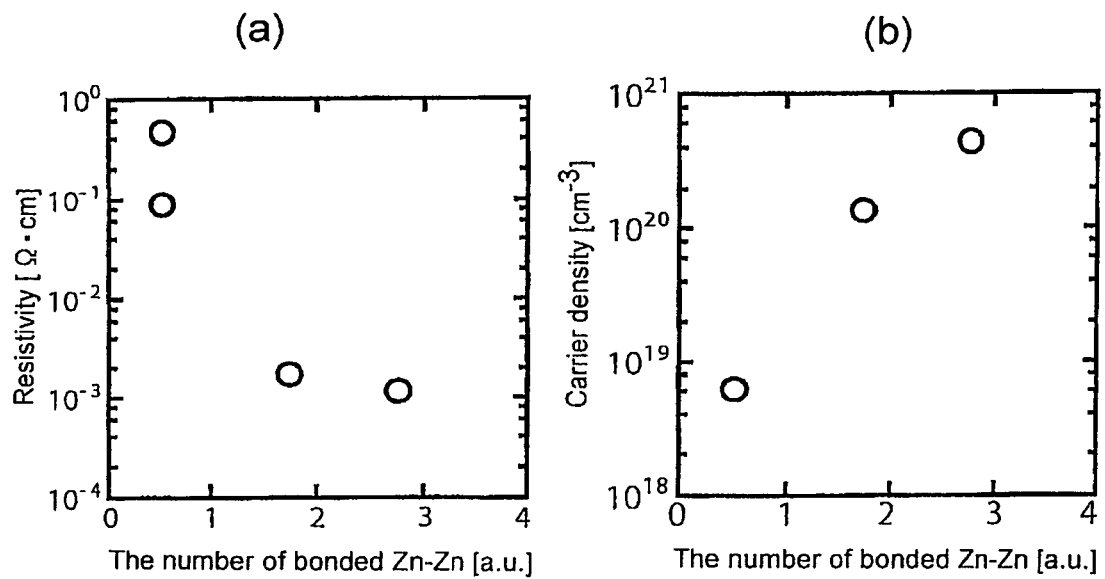
FIG. 9 shows graphs illustrating relationships between the resistivity or carrier density on the vertical axis and the number (arbitrary unit) of bonded zinc atoms that are not bonded with oxygen measured by x-ray excited electron spectroscopy.

FIG. 9 shows graphs illustrating relationships between the resistivity or carrier density on the vertical axis and the number (arbitrary unit) of bonded zinc atoms, on the horizontal axis, which are not bonded with oxygen measured by x-ray excited photo-electron spectroscopy. It is understood from FIG. 9(b) that the carrier density increases as the lattice defect increases. Further, it is understood from FIG. 9(a) that the resistivity decreases as the lattice defect increases.

From the foregoing, it is considered that a large number of defects caused by shortage of oxygen exist on the ZnO crystal of the film formed at low temperatures, and that the defects supply carriers and decrease the resistivity of the ZnO film. Meanwhile, it was recognized that the density of defects generated in the film-forming conditions exemplified herein is not so large to degrade the transmittance of visible light, and that by adjusting the ratio between the zinc atom and oxygen radical to supply to the surface of the substrate in forming the film, it is possible to further decrease the resistivity while maintaining the high transmittance of visible light.

Example 3

Formation of the Zinc Oxide Thin Film on a PET Substrate

Figure 10:
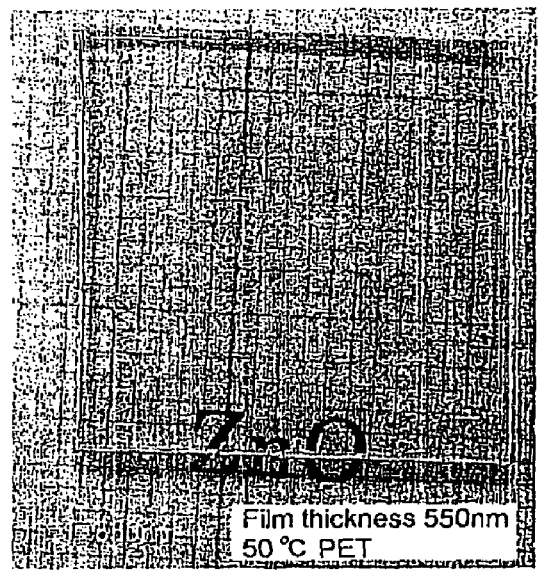
FIG. 10 illustrates characteristics of the zinc oxide thin film formed on a PET (polyethylene terephthalate) substrate.
Figure 10:
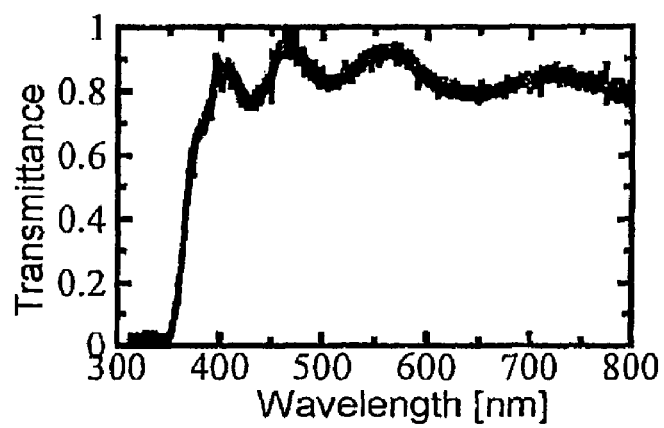
Figure 10:
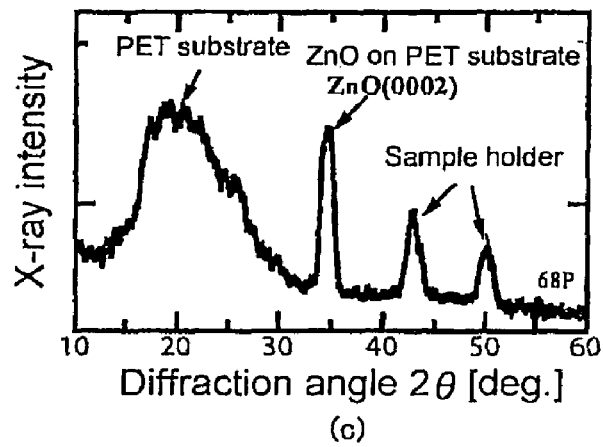

FIG. 10 illustrates characteristics of the zinc oxide thin film formed on a PET (Polyethylene terephthalate) substrate. The zinc oxide thin film with a thickness of 550 nm was formed with the temperature of the substrate set at 50° C. FIG. 10(a) is a photograph of the formed film, and as can be seen from the figure, the film shows sufficient transparency.

FIG. 10(b) is a graph showing the spectrum of light transmittance, and it has been shown that the light transmittance is 80% or more in the visible region. FIG. 10(c) is a graph showing the X-ray diffraction spectrum of the zinc oxide thin film. As shown in FIG. 10(c), the formed thin film has the ZnO (0002) diffraction peak at nearly $2\theta=34.5$ degrees, and it was recognized that the formed thin film is zinc oxide.

Example 4

Formation of the Zinc Oxide Thin Film on a PC Substrate

Figure 11:
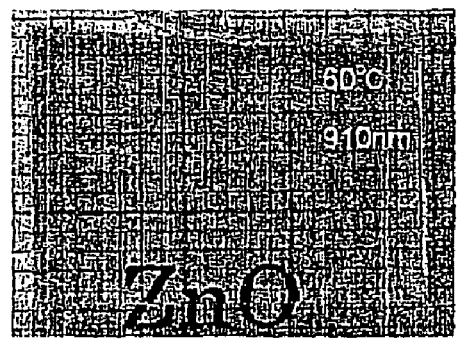
FIG. 11 illustrates characteristics of the zinc oxide thin film formed on a PC (polycarbonate) substrate.
Figure 11:
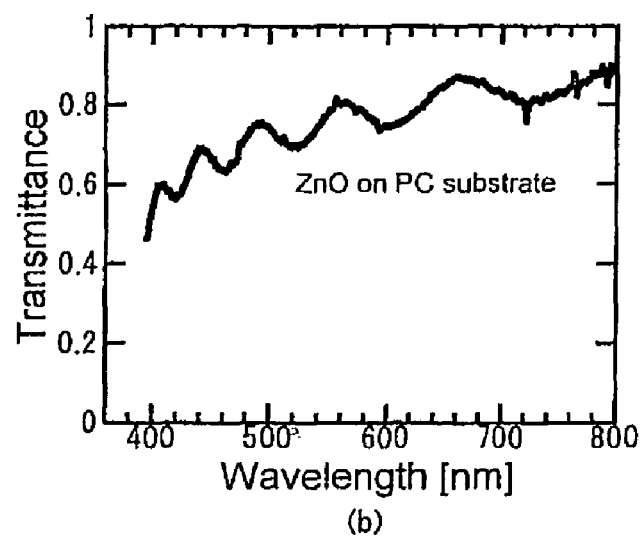
Figure 11:
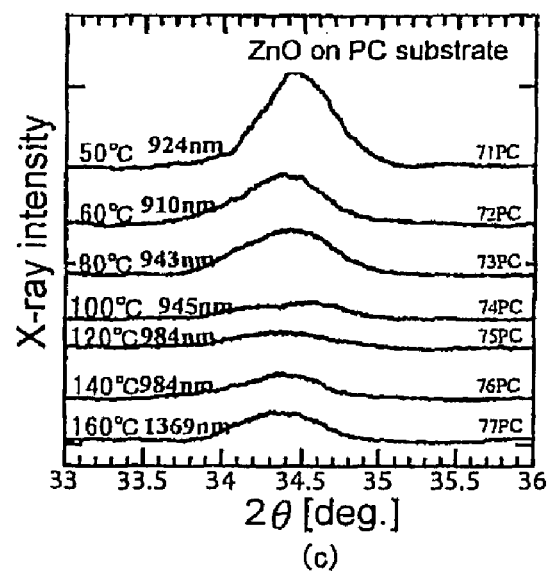

FIG. 11 illustrates characteristics of the zinc oxide thin film formed on a PC (Polycarbonate) substrate. The zinc oxide thin film with a thickness of 910 nm was formed with the temperature of the substrate set at 60° C. FIG. 11(a) is a photograph of the formed film, and as can be seen from the figure, the film shows sufficient transparency.

FIG. 11(b) is a graph showing the spectrum of light transmittance, and it has been shown that the light transmittance is 60% to 80% or more in the visible region. One of reasons why the transmittance is low at around 400 nm is the thickness, and it is considered that the transmittance of 80% or more is obtained in about half such a thickness. FIG. 11(c) is a graph showing X-ray diffraction spectra of the zinc oxide thin film. As shown in FIG. 11(c), the formed thin film has the ZnO (0002) diffraction peak at nearly $2\theta=34.5$ degrees, and it was recognized that the formed thin film is zinc oxide.

Example 5

Formation of the Zinc Oxide Thin Film on a PVC Substrate

Figure 12:
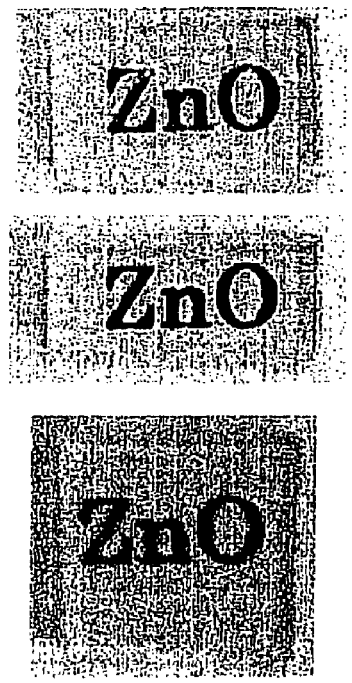
FIG. 12 illustrates characteristics of the zinc oxide thin film formed on a PVC (polyvinyl chloride) substrate.
Figure 12:
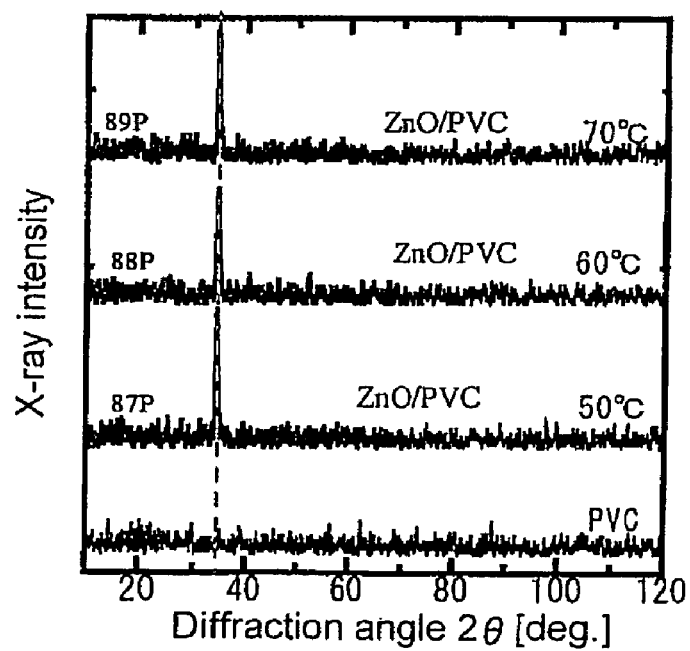

FIG. 12 illustrates characteristics of zinc oxide thin films formed on PVC (Polyvinyl chloride) substrates. The films were formed while setting the temperature of the substrate at 50° C., 60° C. and 70° C. As can be seen from FIG. 12(a), excellent transparency was obtained in the films formed at either of temperatures.

FIG. 12(b) is a graph showing X-ray diffraction spectra of the zinc oxide thin films. As shown in FIG. 12(b), the formed thin films have the ZnO (0002) diffraction peak at nearly 2θ=34.5 degrees, and it was recognized that the formed thin films are zinc oxide.

Example 6

Formation of the Zinc Oxide Thin Film on a PP Substrate

Figure 13:
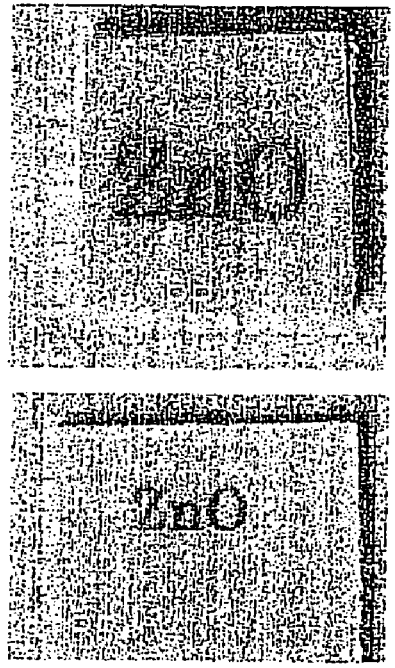
FIG. 13 illustrates characteristics of the zinc oxide thin film formed on a PP (polypropylene) substrate.
Figure 13:
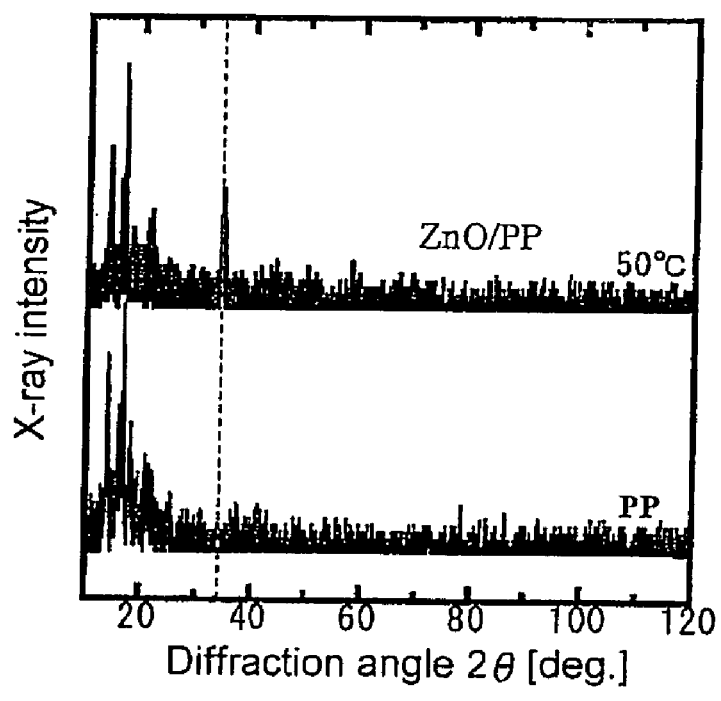

FIG. 13 illustrates characteristics of the zinc oxide thin film formed on a PP (Polypropylene) substrate. The film was formed with the temperature of the substrate set at 50° C. As can be seen from FIG. 13(a), there is not a significant difference in transparency between the PP substrate with the zinc oxide thin film formed thereon (upper photograph) and PP itself (lower photograph). Accordingly, it was recognized that excellent transparency is obtained in the film formed with the temperature of the substrate set at 50° C.

Further, FIG. 13(b) is a graph showing the X-ray diffraction spectrum of the zinc oxide thin film. As shown in FIG. 13(b), the formed thin film has the ZnO (0002) diffraction peak at nearly 2θ=34.5 degrees, and it was recognized that the formed thin film is zinc oxide.

Example 7

Formation of the Zinc Oxide Thin Film with Dopant (Gallium) Doped

Figure 14:
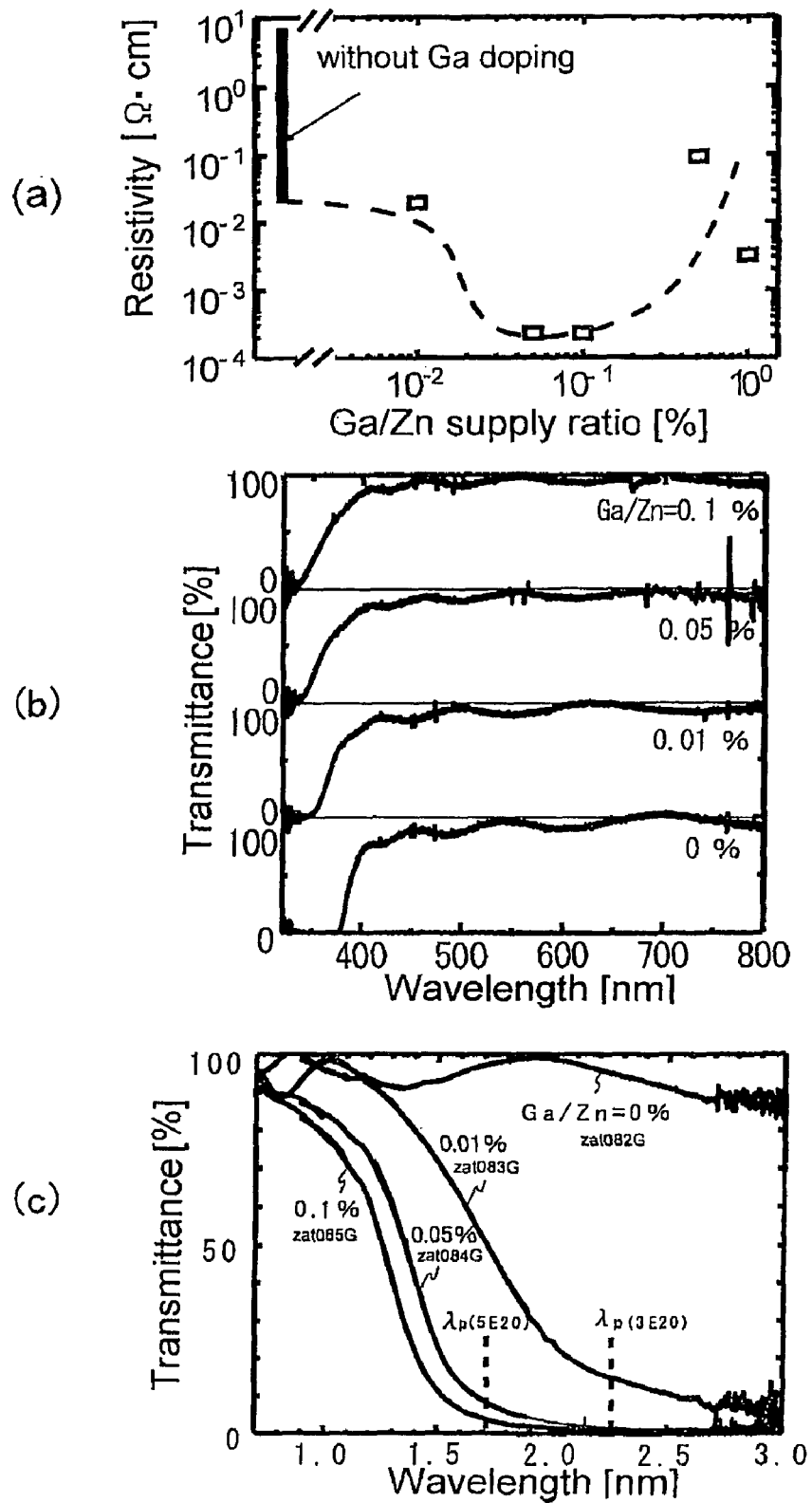
FIG. 14 shows a graph illustrating the relationship between the supply ratio of gallium to zinc and the resistivity of the zinc oxide thin film formed with gallium as a dopant and other graphs.

FIG. 14 shows a graph illustrating the relationship between the supply ratio of gallium to zinc and resistivity of the zinc oxide thin film formed with gallium as a dopant and other graphs. FIG. 14(a) shows the relationship between the supply ratio of gallium to zinc and resistivity when gallium was added to the dopant crucible 13 as a dopant, the temperature of gallium was controlled to between 730° C. and 800° C. by controlling the temperature of the dopant crucible 13, and the supply ratio of gallium to zinc was there by varied in forming the zinc oxide thin film. At this time, the temperature of the substrate was 290° C., the temperature of zinc was 385° C., and the high-frequency power was 150 W.

Figure 15:
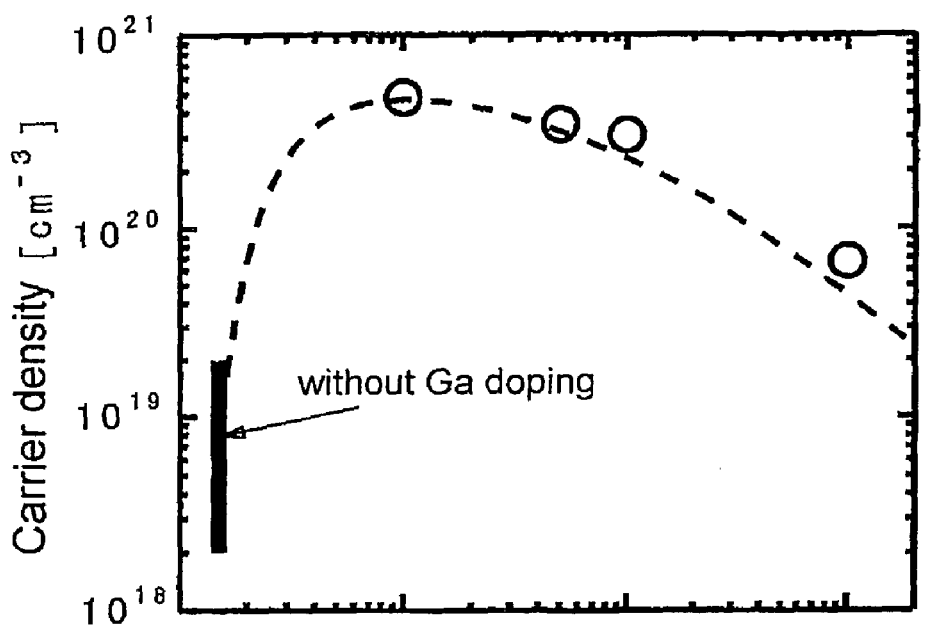
FIG. 15 shows a graph illustrating the relationship between the supply ratio of gallium to zinc and the carrier density and other graphs.
Figure 15:
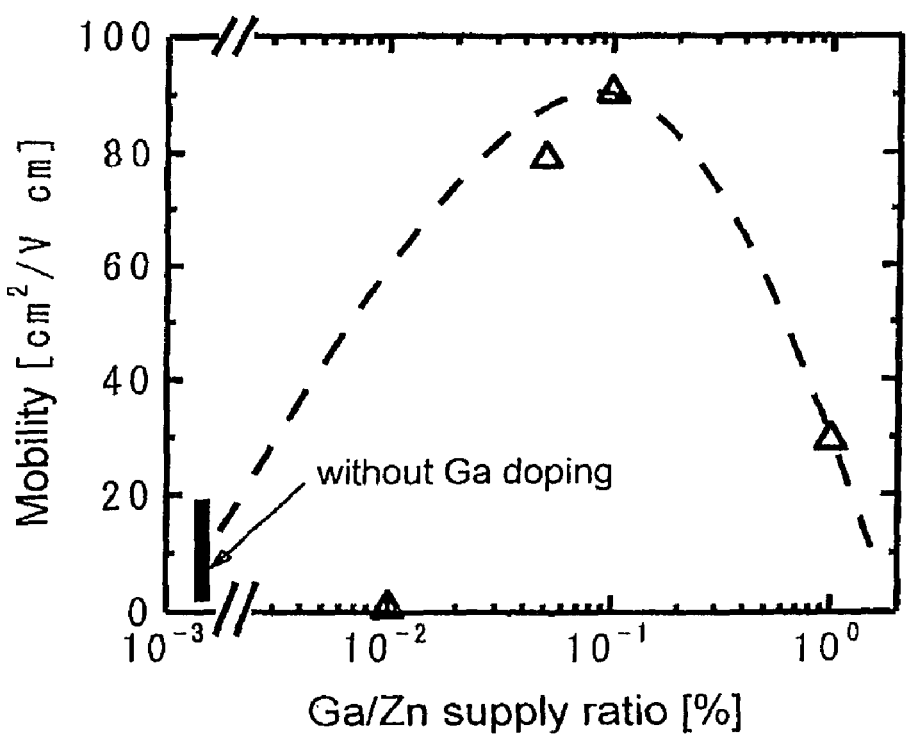

As shown in FIG. 14(a), the zinc oxide thin film with low resistivity was formed when the supply ratio of gallium to zinc is about $10^{-1}$%. The number of gallium atoms at this ratio is as follows:

The number of zinc is $4 \times 10^{22}$ (Zn=$4 \times 10^{22}$) per cubic centimeter of zinc oxide (ZnO). When gallium (Ga) is supplied with the supply amount of 0.1% relative to zinc, since the density of zinc oxide is 5.47 g/cm³, the atomic weight of zinc is 65.39, the atomic weight of oxygen is 15.99, and the atomic weight of gallium is 69.72, the ratio is 65.39:15.99=$M_{zn}$:(5.47−$M_{zn}$), and $M_{zn}$=4.4 grams. Therefore, the number of zinc atoms is $4.4 \times (6 \times 10^{23})/65.39 = 4 \times 10^{22}/cm^3$ The weight of gallium is $4.4 \times 10^{-3}$ (=$M_{GA}$) grams. The number of gallium atoms is $(4.4 \times 10^{-3}) \times (6 \times 10^{23})/69.72 = 4 \times 10^{19}/cm^3$ FIG. 15 shows graphs illustrating the relationship between the supply ratio of gallium to zinc and the carrier density and the like. In FIG. 15(a), when considering that one carrier is generated from one gallium atom, from the carrier density at the gallium/zinc supply ratio that maximizes the mobility, the number of gallium in the zinc oxide thin film is $3 \times 10^{20}/cm^3$. This result is considered caused by the fact that the deposit efficiency of gallium to the substrate is ten times higher than that of zinc. Accordingly, a zinc oxide thin film with the lowest resistivity is formed when the ratio of the dopant to zinc in the zinc oxide thin film is about 1:100.

FIG. 14(b) is a graph illustrating the relationship between the wavelength and transmittance of the zinc oxide thin film formed while varying the supply ratio of gallium to zinc. The supply ratio of Ga/Zn was varied in the range of 0% to 0.1%, and in any supply ratios, almost the same transmittance was obtained in the visible region.

FIG. 14(c) is a graph showing the transmittance in the infrared region. As shown in the figure, it was recognized that the film with the supply ratio of gallium to zinc of 0.1% does not allow IR rays with wavelengths of 1.5 μm or more to pass through, and the film with the supply ratio of gallium to zinc of 0.05% does not allow IR rays with wavelengths of 1.7 μm or more to pass through. From these facts, it is understood that using the zinc oxide thin film enables production of IR shielding transparent sheets, and for example, by covering a window with a zinc oxide thin film sheet produced by this method, it is made possible to block heat from the outside.

Figure 16:
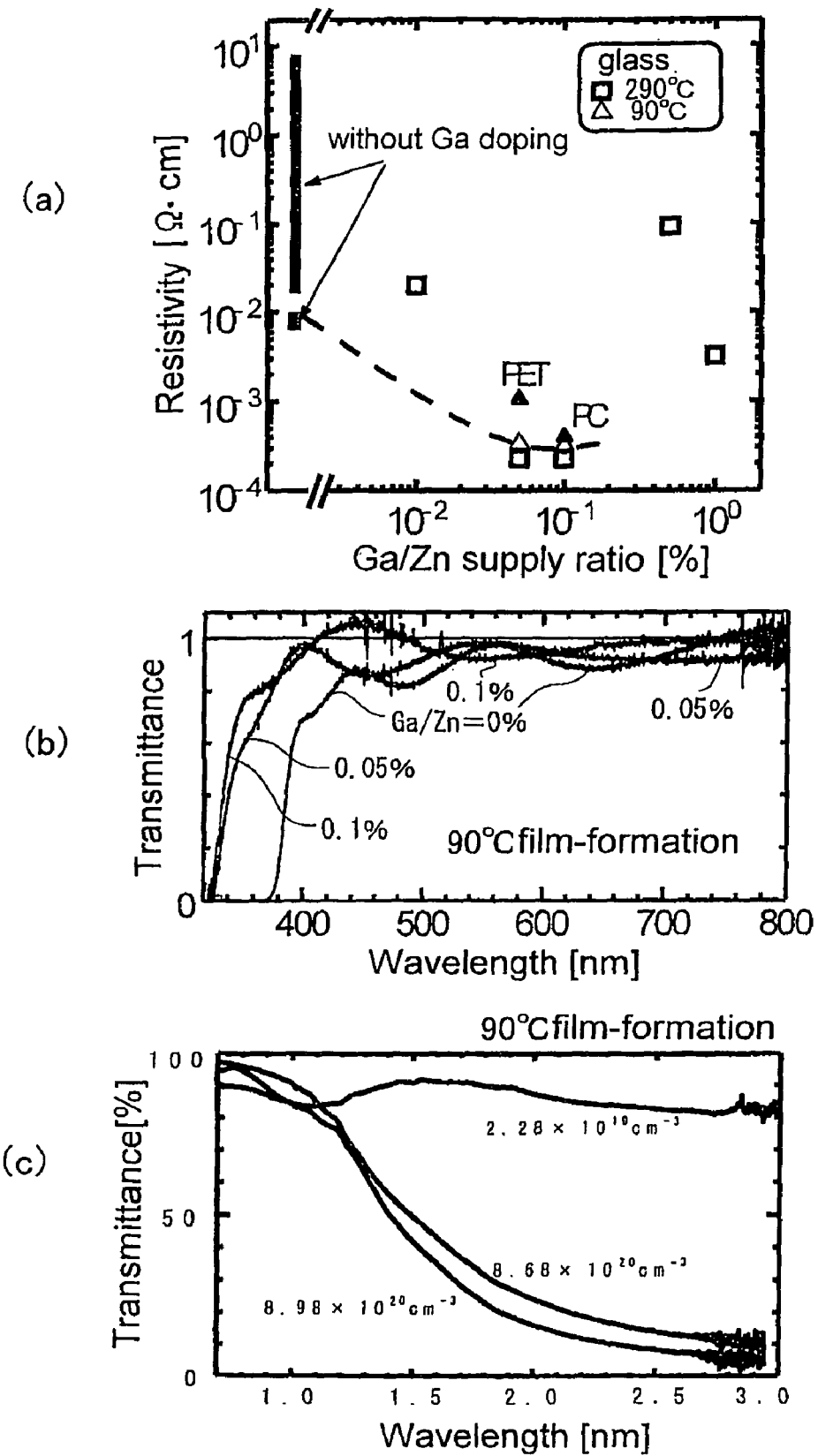
FIG. 16 shows a graph illustrating the relationship between the supply ratio of gallium to zinc and the resistivity of the zinc oxide thin film formed with gallium as a dopant using glass, polyethylene terephthalate (PET), or polycarbonate (PC) as a substrate with its temperature set at low temperature (90° C.) and other graphs.

FIG. 15 shows a graph illustrating the relationship between the supply ratio of gallium to zinc and resistivity of the zinc oxide thin film formed with gallium as a dopant using glass, polyethylene terephthalate (PET), or polycarbonate (PC) as a substrate with its temperature set at low temperature (90° C.) and other graphs. As shown in FIG. 16(a), the resistivity is the lowest in zinc oxide thin films formed on PET and PC substrates in the supply ratio of gallium to zinc of about $10^{-1}$%. FIGS. 16(b) and 16(c) are graphs showing the transmittance of zinc oxide thin films on glass substrates formed similarly at low temperature (90° C.). As shown in FIG. 16(b), the excellent transmittance is obtained in the visible region, and IR rays are shielded in the region more than 2.5 μm.

According to the present invention, it is possible to form zinc oxide thin films with low resistivity and high transparency in the visible region on flexible substrates such as plastic. It is thereby possible to substitute the zinc oxide thin film for the indium tin oxide (ITO) film conventionally used in electronic devices such as digital cameras, DVD videos, plasma display panels, organic EL panels and the like.

This application is based on the Japanese Patent application No. 2005-237141 filed on Aug. 18, 2005, entire content of which is expressly incorporated by reference herein.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method of manufacturing a zinc oxide thin film by reacting oxygen radicals and zinc atoms on a surface of a substrate placed in a film-forming chamber evacuated to a vacuum, wherein the density of crystal defects that are defects of the atomic arrangement of the zinc oxide thin film is controlled by at least a temperature of the substrate, and the zinc oxide thin film is formed, the density of crystal defects is controlled to within a range of $1 \times 10^{18}$ defects/cm³ to $5 \times 10^{21}$ defects/cm³, and wherein the temperature of the substrate is maintained at 400° C. or less by cooling means to form the zinc oxide thin film.

2. The method of manufacturing a zinc oxide thin film according to claim 1, wherein in reacting the oxygen radicals and the zinc atoms on the surface of the substrate to form the zinc oxide thin film, a dopant is supplied to the surface of the substrate to form the zinc oxide thin film.

3. The method of manufacturing a zinc oxide thin film according to claim 2, wherein a supply amount of the dopant is controlled so that the ratio of the dopant to the zinc atoms in the zinc oxide thin film is within a range of 1:10 to 1:1000.

4. The method of manufacturing a zinc oxide thin film according to claim 1, wherein the substrate is a flexible substrate such as plastic.

5. The method of manufacturing a zinc oxide thin film according to claim 4, wherein the flexible substrate is selected from the group consisting of polyethylene terephthalate (PET), polycarbonate (PC), polyvinyl chloride (PVC) and polypropylene (PP).

6. The method of manufacturing a zinc oxide thin film according to claim 1, wherein the density of crystal defects in forming the film is controlled by considering the density of crystal defects recovered by a heat treatment process subsequent to formation of the film.

* * * * *